United States Patent
Hata

(12) 
(10) Patent No.: US 6,417,525 B1
(45) Date of Patent: Jul. 9, 2002

(54) SEMICONDUCTOR LIGHT EMITTER WITH CURRENT BLOCK REGION FORMED OVER THE SEMICONDUCTOR LAYER AND ELECTRODE CONNECTION PORTION FOR CONNECTING THE PAD ELECTRODE TO THE TRANSLUCENT ELECTRODE

(75) Inventor: Toshio Hata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/381,563

(22) PCT Filed: Mar. 18, 1998

(86) PCT No.: PCT/JP98/01135
§ 371 (c)(1),
(2), (4) Date: Feb. 1, 2000

(87) PCT Pub. No.: WO98/42030
PCT Pub. Date: Sep. 24, 1998

(30) Foreign Application Priority Data

Mar. 19, 1997 (JP) ............................................. 9-065727

(51) Int. Cl.[7] ........................... H01L 33/00; H01L 29/40

(52) U.S. Cl. ........................... 257/91; 257/103; 257/99; 257/749

(58) Field of Search ............................ 257/91–103, 13, 257/22, 79–81, 76, 615, 741, 745, 750–751, 763–766, 770–771; 362/555, 800

(56) References Cited

U.S. PATENT DOCUMENTS 5,563,422 A * 10/1996 Nakamura et al. .......... 257/103
6,191,436 B1 * 2/2001 Shibata et al. ................ 257/91

FOREIGN PATENT DOCUMENTS

| JP | Hei 6(1994)-338632 | 12/1994 | |
| JP | Hei 8(1996)-2507688 | 3/1995 | |
| JP | 08250769 A | * 9/1996 | |
| JP | Hei 8(1996)-250769 | 9/1996 | |
| JP | Hei 9(1997)-129930 | 5/1997 | |

* cited by examiner

Primary Examiner—Minh Loan Tran
Assistant Examiner—Thomas L Dickey
(74) Attorney, Agent, or Firm—Morrison & Foerster LLP

(57) ABSTRACT

A semiconductor light emitter characterized by including a semiconductor layer for providing an electric current block region and an electric current injection region on a surface thereof, an electric current block layer formed on the semiconductor layer for defining the electric current block region, a pad electrode formed on the electric current block layer, and a light-transmissive electrode formed on the semiconductor layer for defining the electric current injection region, wherein the pad electrode has an electrode connection portion for connection with the light-transmissive electrode. Such a semiconductor light emitter can prevent failure in electric current introduction into the light emitter owing to disconnection of the light-transmissive electrode and increase of the resistance of the light-transmissive electrode. It is possible to produce light emitters with good behavior in a good yield.

16 Claims, 8 Drawing Sheets

(units of μm)

(units of μm)

SEMICONDUCTOR LIGHT EMITTER WITH CURRENT BLOCK REGION FORMED OVER THE SEMICONDUCTOR LAYER AND ELECTRODE CONNECTION PORTION FOR CONNECTING THE PAD ELECTRODE TO THE TRANSLUCENT ELECTRODE

TECHNICAL FIELD

The present invention relates to a semiconductor light emitter, more particularly a light emitter in which a surface of a semiconductor layer serves as a light emission light-transmissive face.

BACKGROUND ART

A semiconductor light emitter which has an electric current block function on a surface thereof is proposed, for example, by Japanese Unexamined Patent Publication No. HEI 8(1996)-250769. As shown in FIG. 11, the semiconductor light emitter is so constructed that an N-type layer (semiconductor layer) 200 and a P-type layer (semiconductor layer) 300 are disposed on a sapphire substrate 100 and an electric current block region and an electric current injection region are provided on the P-type layer 300.

In this semiconductor light emitter, the current block region is formed as a current block layer ($SiO_2$) 400 of about 300 nm thickness, and a pad electrode 700 having the same size as the current block layer 400 is formed on the current block layer 400 with intervention of a barrier layer (Ti, Cr or the like) 500 of about 30 nm thickness and a light-transmissive electrode 600.

Further, the current injection region is constructed of a light-transmissive electrode 600 which is formed integrally with a light-transmissive electrode 600 disposed on the current block layer 400, that is, so as to cover the current block layer 400.

The pad electrode 700 is formed of a thick metal film of about 1,000 nm thickness and does not transmit light at all. On the other hand, the light-transmissive electrode 600 is formed of a very thin metal film having a thickness of about 10 nm or less and thus can transmit light to some extent. Therefore, light generated in the semiconductor layer 300 can easily be taken out at a portion where the pad electrode 700 and the current block layer 400 do not exist. Furthermore, since the current block layer 400 is provided below the pad electrode 700 which does not transmit light for blocking the flow of electric current, the light emission efficiency as a whole is improved.

However, since the light-transmissive electrode 600 is much thinner than the thickness of the current block layer 400, disconnection occurs at a sidewall of the current block layer 400 because of a difference in level between the light-transmissive electrode and the current block layer. Accordingly, there arises a problem that the pad electrode 700 and the light-transmissive electrode 600 disposed in the current injection region are not continuously connected and thus the resistance of the light-transmissive electrode 600 rises at this site. For this reason, electric current from the pad electrode 700 cannot be efficiently injected into the P-type layer 300 via the light-transmissive electrode 600 at the sidewall of the current block layer 400. As a result, there arises a problem that the light emitter cannot fulfill its functions of generating light sufficiently and taking out the generated light efficiently.

DISCLOSURE OF THE INVENTION

As a result of the inventors' earnest study to solve the above-described problems, it has been found that the thickness of the light-transmissive electrode reduces at the sidewall of the current block layer to about one-third to one-tenth of its thickness on a level face and that the disconnection remarkably occurs where the thickness of the light-transmissive electrode becomes one-tenth or less of the thickness of the current block layer. The inventors has also found out that the light-transmissive electrode becomes of high resistance if its thickness decreased to 1 nm or less at the sidewall of the current block layer and that as a result, electric current cannot be efficiently injected to the current injection region. From these findings, the inventor has made various studies on the construction of light emitters which allows an efficiently injection of electric current into the current injection region and also an efficient take-out of the generated light via the light-transmissive electrode, finally to achieve the present invention.

According to the present invention, it thus provides a semiconductor light emitter comprising a semiconductor layer for providing an electric current block region and an electric current injection region on a surface thereof, an electric current block layer formed on the semiconductor layer for defining the electric current block region, a pad electrode formed on the electric current block layer and a light-transmissive electrode formed on the semiconductor layer for defining the electric current injection region, the semiconductor light emitter being characterized in the pad electrode has an electrode connection portion for connection with the light-transmissive electrode.

DESCRIPTION OF PREFERRED EMBODIMENTS

Figure 1A:
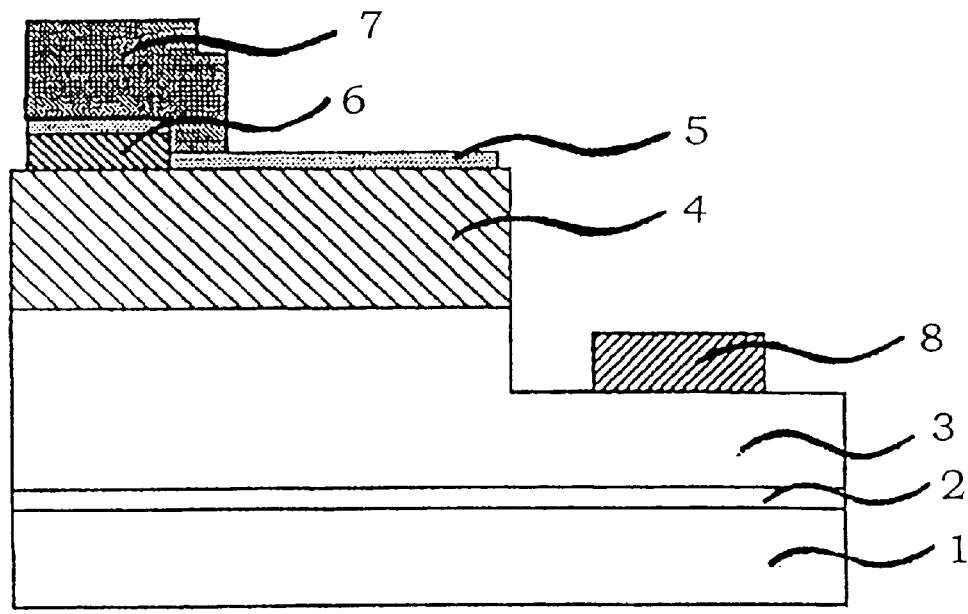
FIGS. 1(*a*) and 1(*b*) illustrate a light emitter of a gallium nitride compound semiconductor of the present invention, and FIG. 1 (*a*) is a schematic sectional view and FIG. 1(*b*) is a schematic plan view.

The semiconductor light emitter of the present invention is mainly composed of a semiconductor layer, a current block layer, a pad electrode and a light-transmissive electrode. These elements such as the semiconductor layer are preferably formed on a substrate, and further, another electrode corresponding to the pad electrode is preferably formed on the semiconductor layer or the substrate.

Any substrate may be used without particular limitation as far as it is usually used as a substrate for a light emitter. For example, any semiconductor substrate of silicon, germanium or the like, any compound semiconductor substrate of SiGe, SiC, GaAs, InGaAs or the like, or an insulative substrate of glass, sapphire, quarts, a resin or the like can be used, among which the insulative substrate is preferred. Said another electrode is not particularly limited provided that it is formed of a usual electrically conductive material. The thickness thereof can be selected as appropriate in view of functions, mechanical strength and the like of the emitter.

The semiconductor layer of the light emitter in accordance with the present invention has at least one pn junction. The semiconductor layer may be a semiconductor layer of a homo-structure in which an n-type layer and a p-type layer of a semiconductor of the same composition are laminated, or may be a semiconductor layer of a single hetero-structure or a double hetero-structure in which a p-type layer and an n-type layer of semiconductors of different compositions are laminated in two or more layers. It is noted that the semiconductor layer may be formed on the substrate with intervention of an intermediate layer or a buffer layer.

For the semiconductor layer, gallium nitride semiconductors, for example, GaN, InGaN, InN, AlN, AlGaN and $In_sAl_tGa_{1-s-t}N$ ($0 \leq s$, $0 \leq t$, $s+t \leq 1$) can be mentioned, among which $In_sAl_tGa_{1-s-t}N$ ($0 \leq s$, $0 \leq t$, $s+t \leq 1$) is preferred. These semiconductor layers may contain a n-type or p-type impurity, for example, an impurity such as silicon, germanium or the like, or an impurity such as magnesium, zinc, carbon or the like in a concentration of about $1 \times 10^{16}$ to about $1 \times 10^{19}$ $cm^{-3}$.

The semiconductor layer may be formed by a known method, for example, an organic metal chemical vapor deposition (MOCVD) method, a molecular beam epitaxy (MBE) method, a CVD method or the like. The impurity may be doped at the same time as the formation of the semiconductor layer or may be doped by an ion implantation or a thermal diffusion method after the semiconductor layer is formed.

The semiconductor layer may preferably be formed in a rectangular shape or in a substantially rectangular shape and, as described below, the current block layer and the light-transmissive electrode are mainly formed on the surface thereof to provide a current block region and a current injection region, respectively.

In the light emitter of the present invention, the current block region is defined by the formation of the current block layer on the semiconductor layer. This region occupies about 3 to 30% of the area of the semiconductor layer. In the case where the semiconductor layer is formed in a rectangular shape or a substantially rectangular shape, this current block layer may preferably be formed in or near a corner of the semiconductor layer, more preferably at a location occupying a corner of the semiconductor layer.

The current block layer defining the current block region is preferably formed of an insulative dielectric material. For example, films of silicon oxide material, silicon nitride material, titanium oxide material and aluminum oxide material can be mentioned, among which $SiO_2$ and titanium oxide are preferred. The current block layer may be formed in either a single layer or a laminate layer. The thickness thereof is not particularly limited provided that it ensures insulation, and for example, the thickness may be about 150 nm or more. The maximum limit for the thickness of the current block layer may preferably be such that does not exceed the double of the thickness of the pad electrode described later, for example, about 4,000 nm or less.

The current block layer can be formed by various known methods such as a CVD method using silane gas and hydrogen gas, a sputtering method and the like.

In the present invention, the pad electrode is formed mainly above the current block layer and has an electrode connection portion for connection with the light-transmissive electrode formed on the current injection region as described later.

Since the pad electrode, as described below, is for supplying current to the inside of the light emitter by being connected to an external wire, for example, the pad electrode preferably has a sufficient thickness for preventing mechanical damage to the underlying current block layer and semiconductor layer when the wire is connected to the pad electrode. On the other hand, if the pad electrode is too thick, distortion intrinsic to the material for the pad electrode becomes so large as to lead to the peeling-off of the current block layer existing under the pad electrode or induce defects in crystals of the light emitter via the current block layer, which disadvantageously results in poor reliability. For these reasons, the pad electrode preferably has a thickness within the range of about 500 to 2,000 nm.

In addition, most preferably, the thickness of the pad electrode is equal to or greater than the thickness of the current block layer so that the pad electrode can be formed integrally with the electrode connection portion which connects to the light-transmissive electrode formed on the current injection region described later, without disconnection. However, according to tests carried out actually, where the pad electrode (and the electrode connection portion) was equal to or more than half the thickness of the current block layer, no defects such as disconnection, an increase in resistance and the like due to a difference in level at the periphery of the current block layer were observed.

Figure 10:
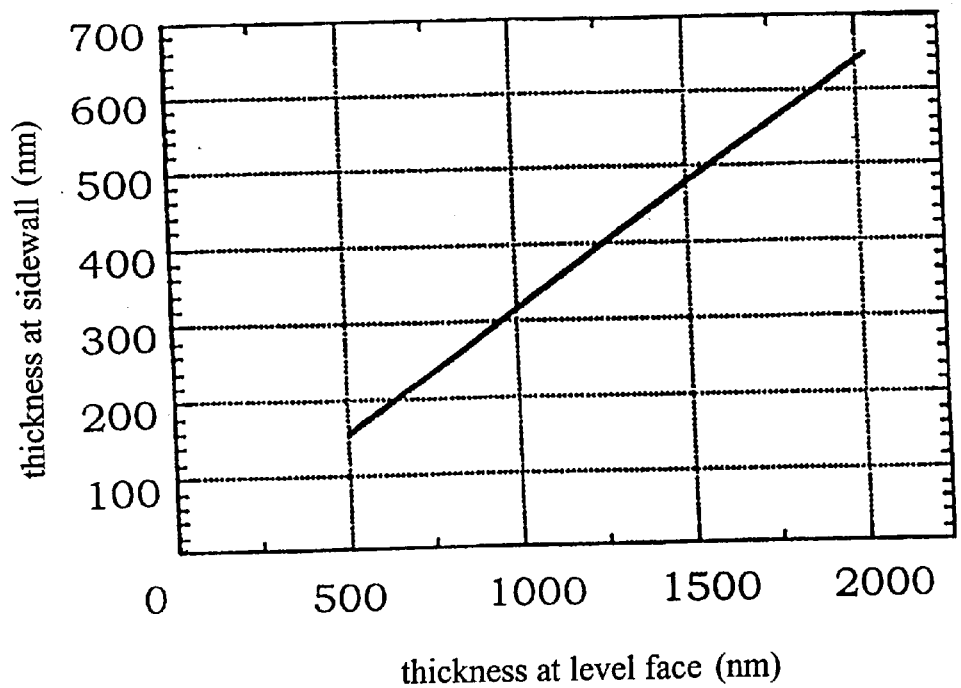
FIG. 10 is a graph showing relationship between the thickness of a pad electrode on a level face and the thickness thereof at a sidewall.
Figure 11:
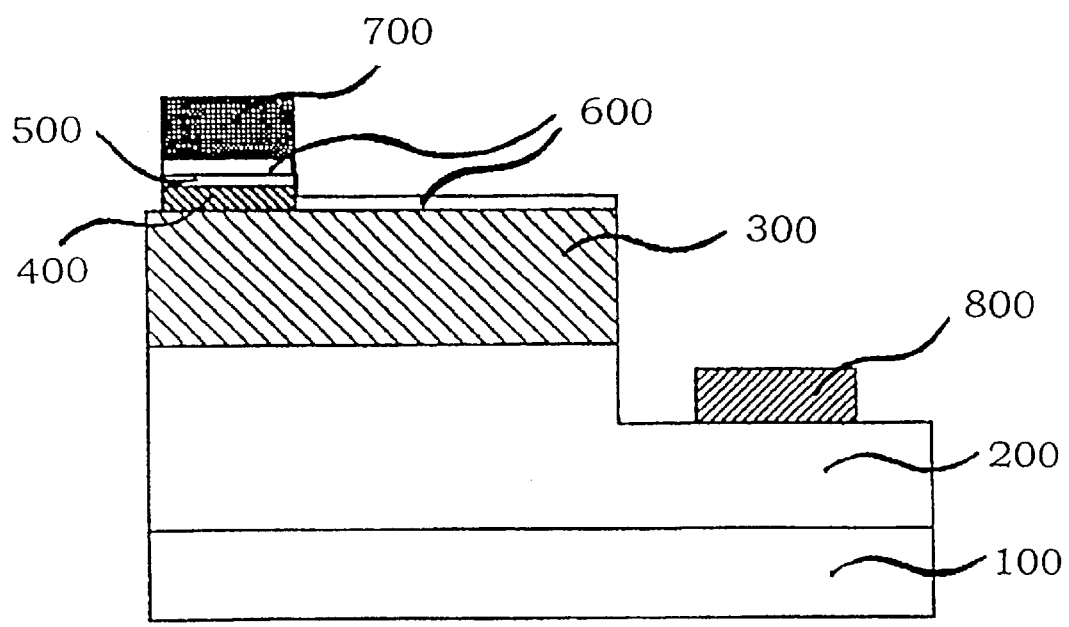
FIG. 11 is a schematic sectional view illustrating a conventional device of a gallium nitride compound semiconductor.

In other words, in the case where the thickness of the pad electrode (and the electrode connection portion) is about half as thick as the current block layer, the thickness of the pad electrode at the sidewall of the current block layer is ensured to be about one-third of the thickness of the pad electrode on a level face, according to FIG. 10 which represents relationship between the thickness of the pad electrode on the level face and that at the sidewall of the current block layer. This shows that, even in the case where the pad electrode and the block layer have thicknesses of about 1:2 to about 1:1, the thickness of the pad electrode is ensured sufficiently at the sidewall of the current block layer, and the pad electrode can positively be contacted with the light-transmissive electrode via the electrode connection portion.

Results of further study about cases where the thickness of the current block layer was larger than the thickness of the pad electrode showed that, where the current block layer was more than three times as thick as the pad electrode, the thickness of the pad electrode at the sidewall of the current block layer was sometimes smaller than 2 nm locally. Therefore, even though the pad electrode was provided with the electrode connection portion, the connection between the pad electrode and the light-transmissive electrode cannot be ensured sufficiently, and as a result, the yield of conforming light emitters declines. For these reasons, the thickness of the current block layer may preferably be not greater than about double the thickness of the pad electrode. Conversely, the thickness of the pad electrode may preferably be not smaller than half the thickness of the current block layer.

Materials for the pad electrode are not particularly limited provided that the pad electrode is formed of an electrically conductive material. For example, the pad electrode may be formed of aluminum, gold, copper, nickel, silver, an oxide semiconductor (ITO etc.) or the like.

The shape of the pad electrode is not particularly limited but may be a polygon such as a triangle or a quadrangle integrally with the electrode connection portion, or the shape excluding the electrode connection portion may be generally the same as that of the current block layer. On the other hand, the electrode connection portion may be formed integrally with the pad electrode in a polygonal shape as described above or may be formed in a convex shape of a polygon or the like with respect to the pad electrode. The size of the pad electrode (excluding the electrode connection portion) may be substantially the same as that of the current block layer, or may be smaller than that of the current block layer so as not to cover a partial region of the current block layer. Here, the region of the current block layer which is not covered with the pad electrode can be allowed to function as a light outlet portion from which light produced in the semiconductor layer can be taken out. The light outlet portion in this case may be the entire peripheral region of the pad electrode except where the electrode connection portion is formed, or may be part of the peripheral region. The electrode connection portion, which is a part of the pad electrode, is for efficiently injecting electric current from the pad electrode to the light-transmissive electrode. The electrode connection portion preferably connects to the light-transmissive electrode with a connection area of about 5 µm width or wider. In other words, the electrode connection portion preferably has an area of about 8 to 68×10$^{-6}$ cm$^2$ for connection.

The pad electrode is preferably provided with a wire formed for external electrical connection. This wire is preferably extended from the current block region to the outer periphery of the light emitter by the shortest distance. In other words, the wire is preferably extended in such a manner that the wire does not overlap the semiconductor layer of the light emitter.

Further, the light-transmissive electrode of the present invention is formed mainly to connect directly to the semiconductor layer and defines the current injection region. The light-transmissive electrode can also be an electrode allowing efficient injection of electric current into the current injection region and efficient take-out of the light produced in the semiconductor layer (for example, at a light-transmittancy of about 30 to 100%). It is noted that the light-transmissive electrode may be formed from the current injection region to cover the current block layer. Materials for the light-transmissive electrode are not particularly limited provided that they have the above-mentioned light-transmittancy. For example, metals such as nickel, aluminum, gold, copper, silver, titanium, tantalum, zinc, palladium and platinum and electrically conductive light-transmissive materials such as SnO$_2$, ZnO and ITO can be mentioned. These materials may be formed in a single layer film or a laminate layer film. The thickness can be adjusted as appropriate to have a proper light-transmittancy in the cases where the above-mentioned materials are used. For example, the thickness is preferably about 20 nm or less. On the other hand, in order that electric current is uniformed in a lateral direction on the surface of the semiconductor layer, the resistance of the light-transmissive electrode itself in the lateral direction needs to be sufficiently small compared with that of the semiconductor layer. Accordingly, the thickness of the light-transmissive electrode is about 4 nm or more. More particularly, in the case where a Ni/Au laminate film is used, the thickness is preferably within the range of about 2 to 10 nm/2 to 10 nm. In the case where a titanium single film is used, the thickness is preferably within the range of about 2 to 20 nm, more preferably about 2 to 10 nm.

Examples of semiconductor light emitters in accordance with the present invention are now described in detail with reference to the drawings, but the present invention is not limited to these examples.

EXAMPLE 1

Figure 1B:
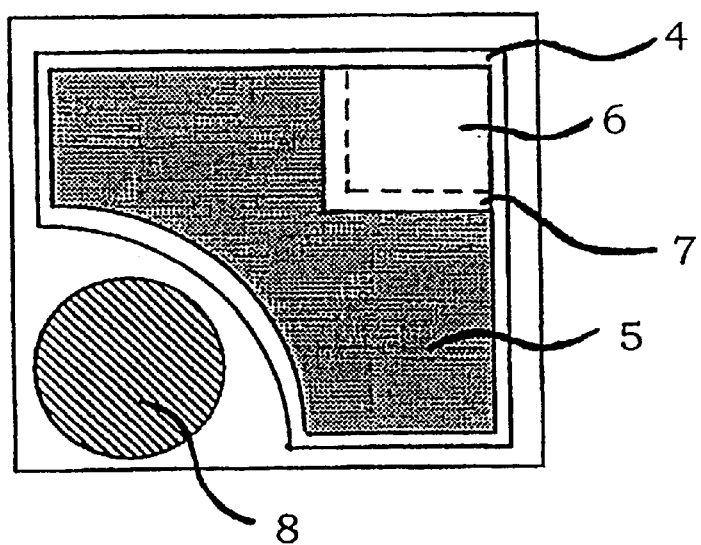

The construction of electrodes of a light emitter of a gallium nitride compound semiconductor in accordance with the present invention is shown in FIGS. 1(a) and 1(b).

In this light emitter, a buffer layer 2, an n-type gallium nitride compound semiconductor layer 3 and a p-type gallium nitride compound semiconductor layer 4 are sequentially disposed on an insulative substrate 1. A current block layer 6 and a light-transmissive electrode 5 are formed on the p-type gallium nitride compound semiconductor layer 4, which serves as a light emitting face. A pad electrode 7 having an electrode connection portion which is connected to the light-transmissive electrode 5 is formed on the current block layer 6. An n-type electrode 8 is formed on the n-type gallium nitride compound semiconductor layer 3.

A process for producing the above-described light emitter is described below.

First, the AlGaN buffer layer 2, the n-type gallium nitride compound semiconductor layer 3 and the p-type gallium nitride compound semiconductor layer 4 are formed on the sapphire substrate 1.

Next, the current block layer 6 of SiO$_2$ of 300 nm thickness is formed on the p-type gallium nitride compound semiconductor layer 4 in such a manner that it will remain in the proximity of a corner of the emitter.

Then, the p-type gallium nitride compound semiconductor layer 4 is partially etched until the n-type gallium nitride compound semiconductor layer 3 is exposed using a patterning technique and an etching technique.

Subsequently, the light-transmissive electrode 5 including two layers of a Ni layer of 3 nm thickness and an Au layer of 4 nm thickness is formed to cover the surface of the P-type gallium nitride compound semiconductor layer 4 and an almost entire surface of the current block layer 6.

Then, an Au layer which will be the pad electrode 7 and the electrode connection portion is formed to a thickness of 800 nm to cover the current block layer 6 and the periphery thereof. In other words, the Au layer is formed to cover the current block layer 6 entirely and to extend onto the light-transmissive electrode 5 at two sides of the current block layer 6. Additionally, in this example, the current block layer 6 was formed in a square whose sidelength is 100 µm, and the pad electrode 7 was formed in a square whose sidelength is 110 µm. Accordingly, the pad electrode 7 coveres sidewalls of the current block layer 6 and have the electrode connection portion directly connecting to the light-transmissive electrode 5.

Further, the n-type electrode 8 of a Ti film and an Al film was formed on the n-type gallium nitride compound semiconductor layer 3. Thus, the light emitter was produced.

As described above, since the pad electrode 7 was formed to be larger than the current block layer 6, the pad electrode 7 was positively connected to the light-transmissive electrode 5 in a region where the current block layer 6 was absent, via the electrode connection portion of the pad electrode 7 in a belt-like region of about 10 μm width at the surrounding of the current block layer 6.

Further, since the thickness (300 nm) of the current block layer 6 was set to be smaller than the thickness (800 nm) of the pad electrode 7, the pad electrode 7 on the current block layer 6 could positively be connected to the electrode connection portion at the surrounding of the current block layer 6. Thus, the breaking of connection and the increase of resistance at the sidewalls of the current block layer 6, which had been conventional problems, could be avoided with good reproducibility.

Therefore, the current induced from the pad electrode 7 could be injected uniformly into the p-type gallium nitride compound semiconductor layer 4 via the electrode connection portion and the light-transmissive electrode 5, thereby to bring the light emitter into function.

EXAMPLE 2

Figure 2:
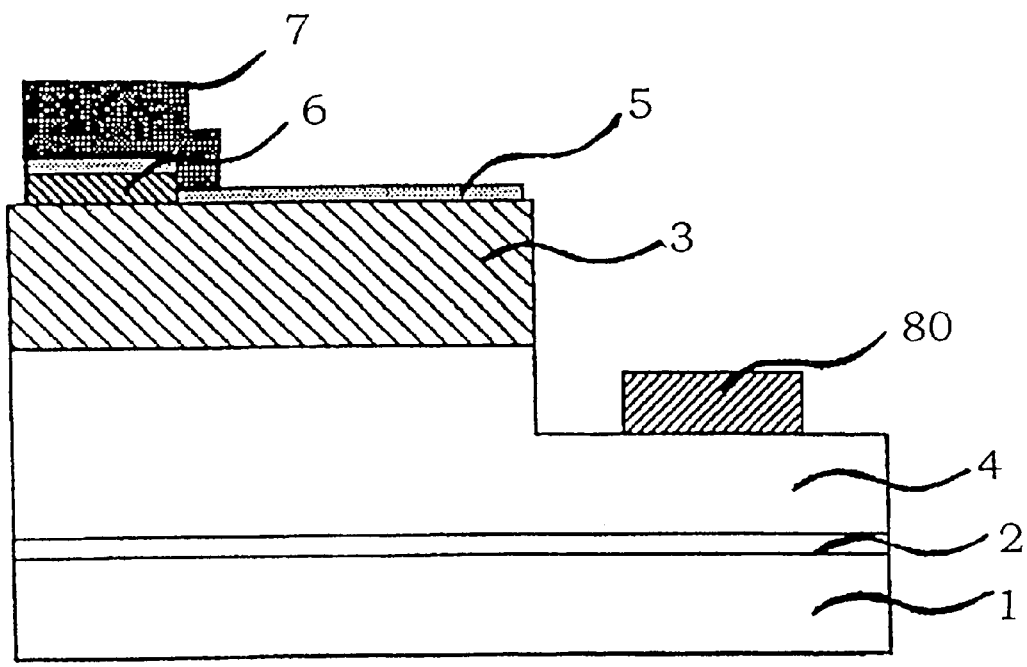
FIG. 2 is a schematic sectional view illustrating another light emitter of a gallium nitride compound semiconductor of the present invention.

Another light emitter of a gallium nitride compound semiconductor in accordance with the present invention is shown in FIG. 2.

In this light emitter, a buffer layer 2 of AlGaN, a p-type gallium nitride compound semiconductor layer 4 and an n-type gallium nitride compound semiconductor layer 3 are sequentially disposed on an insulative substrate 1. A current block layer 6 of silicon nitride, a light-transmissive electrode 5 of titanium and a pad electrode 7 are formed on the n-type gallium nitride compound semiconductor layer 3, which serves as a light emitting face.

A process for producing this light emitter is described below.

First, the AlGaN buffer layer 2, the p-type gallium nitride compound semiconductor layer 4 and the n-type gallium nitride compound semiconductor layer 3 are sequentially formed on the substrate 1 of sapphire.

Next, the current block layer 6 of silicon nitride is formed to a thickness of 400 nm on the n-type gallium nitride compound semiconductor layer 3.

Subsequently, the n-type gallium nitride compound semiconductor layer 3 is partially etched until the p-type gallium nitride compound semiconductor layer 4 is exposed.

Then, the light-transmissive electrode 5 of Ti is formed to a thickness of 7 nm to cover the surface of the n-type gallium nitride compound semiconductor layer 3 and the current block layer 6.

Then, an Au layer which serves as the pad electrode 7 and an electrode connection portion is formed to a thickness of 800 nm to cover the current block layer 6 and the periphery thereof. Here, the pad electrode 7 is formed to be larger than the current block layer 6. That is, as in Example 1, the current block layer 6 is formed in a rectangle of 100 μm×120 μm, and the pad electrode 7 is formed in a rectangle of 125 μm×150 μm. Thereby, the pad electrode 7 is connected directly to the light-transmissive electrode 5 on the n-type gallium nitride compound semiconductor layer 3 where the current block layer 6 is not present, via an electrode connection portion in a region of about 25 μm to about 30 μm width.

Lastly, a p-type electrode 80 comprised of a Ni film and a Au film is formed on the surface of the p-type gallium nitride compound semiconductor layer 4. The light emitter is thus produced.

Also in the above-described light emitter, the thickness of the pad electrode 7 is equal to or larger than the thickness of the current block layer 6, and the electrode connection portion which extends from above the current block layer is formed as part of the pad electrode 7. Thereby, the pad electrode 7 can positively be contacted with the light-transmissive electrode 5 on the n-type semiconductor layer 3 via the electrode connection portion, and the breaking of connection at the electrode portion and the increase of resistance can be prevented.

Therefore, also in this example, the current induced from the pad electrode 7 can be injected uniformly into the n-type gallium nitride compound semiconductor layer 3 via the light-transmissive electrode 5, thereby to bring the light emitter into function.

EXAMPLE 3

Figure 3A:
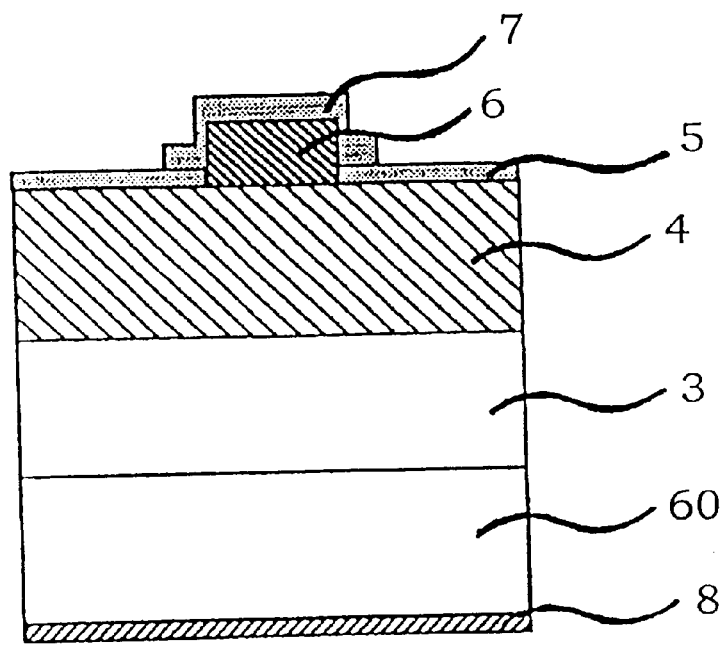
FIGS. 3(*a*) and 3(*b*) illustrate still another light emitter of a gallium nitride compound semiconductor of the present invention, and FIG. 3(*a*) is a schematic sectional view and FIG. 3(*b*) is a schematic plan view.
Figure 3B:
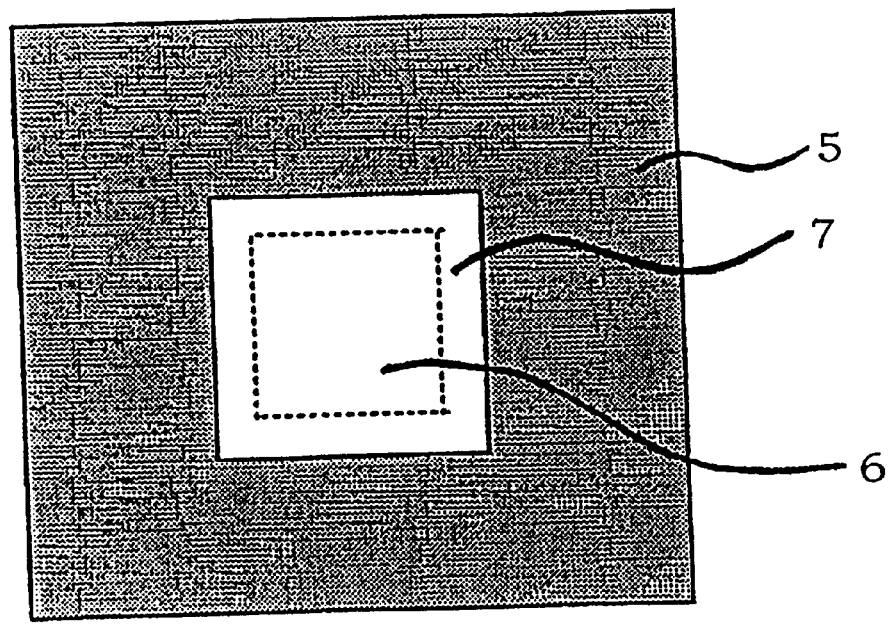

Still another light emitter of a gallium nitride compound semiconductor in accordance with the present invention is shown in FIGS. 3(a) and 3(b).

In Example 3, an n-type gallium nitride compound semiconductor layer 3 and a p-type gallium nitride compound semiconductor layer 4 are sequentially disposed on an n-type electrically conductive substrate 60. A current block layer 6 of titanium oxide and a light-transmissive electrode 5 are formed on the p-type gallium nitride compound semiconductor layer, which serves as a light emitting face. A pad electrode 7 having an electrode connection portion which contacts the light-transmissive electrode 5 is formed on the current block layer 6 and its outer periphery. Further, an n-type electrode 8 is formed on the rear side of the n-type conductive substrate 60.

A process for producing the above-described light emitter is described below.

First, the n-type gallium nitride compound semiconductor layer 3 and the p-type gallium nitride compound semiconductor layer 4 are formed on the n-type SiC substrate 60. Then, the current block layer 6 of titanium oxide is formed to a thickness of 100 nm on a central portion of the p-type gallium nitride compound semiconductor layer 4. At this time, the current block layer 6 is formed in a square whose sidelength is 80 μm.

Then, the light-transmissive electrode 5 comprised of a Ni film of 2 nm thickness and an Au film of 5 nm thickness is formed to cover the surface of the p-type gallium nitride compound semiconductor layer 4 and the current block layer 4.

Subsequently, the pad electrode 7 and an electrode connection portion of an Au film of 1,000 nm thickness are formed on the current block layer 6. At this time, the pad electrode 7 is formed in a square whose sidelength is 100 μm, and the center of the pad electrode 7 is put in coincidence with the center of the current block layer 6.

Lastly, after forming the n-type electrode is formed on the rear side of the substrate 60, the substrate is cut in a 400 μm square by scribing to obtain a light emitter.

In the light emitter thus produced, the pad electrode 7 has the electrode connection portion extending from each side of the current block layer 6 to contact the light-transmissive electrode 6 with an overlap of 10 μm width. Thereby, the current induced from the pad electrode 7 can be injected uniformly into the p-type gallium nitride compound semiconductor layer 4 via the light-transmissive electrode 5, thereby to bring the light emitter into function.

EXAMPLE 4

Figure 4:
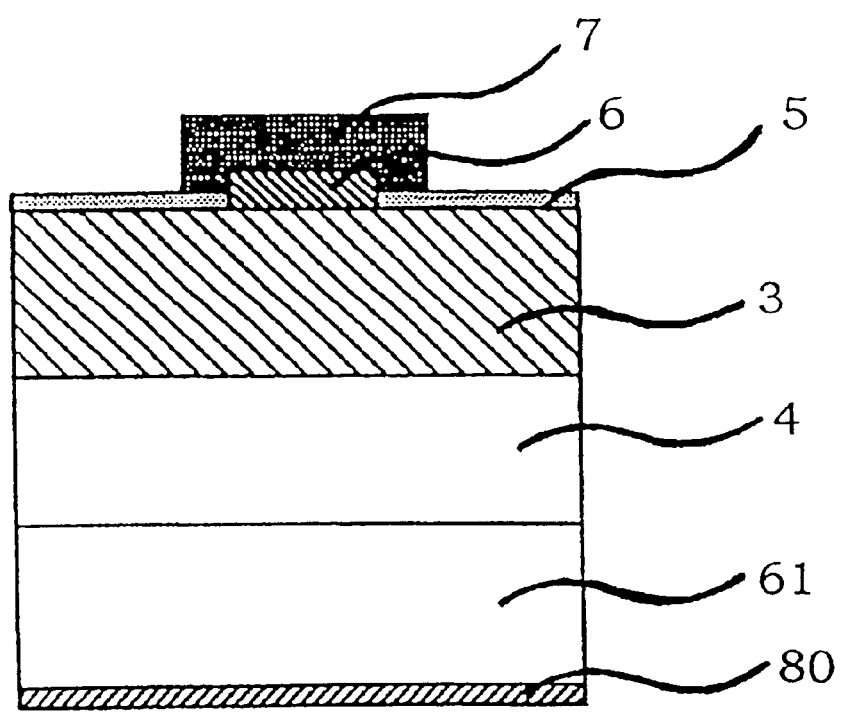
FIG. 4 is a schematic sectional view illustrating still another light emitter of a gallium nitride compound semiconductor of the present invention.

Still another light emitter of a gallium nitride compound semiconductor in accordance with the present invention is shown in FIG. 4.

In this light emitter, a p-type gallium nitride compound semiconductor layer (light emitting layer) 4 and an n-type gallium nitride compound semiconductor layer 3 are sequentially formed on a p-type electrically conductive SiC substrate 61. A current block layer 6 comprised of a silicon nitride oxide (SiON) film of 150 nm thickness is formed on a central portion of the n-type gallium nitride compound semiconductor layer 3. A light-transmissive electrode 5 (having a transmittancy of 40% to the light emitted from the light emitting layer 4) comprised of a single layer of a titanium film of 5 nm thickness is formed on the n-type gallium nitride compound semiconductor layer 3 except on the current block layer 6. A pad electrode 7 comprised of an Al film of 2,000 nm thickness is formed on the current block layer 6 and on a region of the light-transmissive electrode 5 surrounding the current block layer 6. Further, a p-type electrode 80 comprised of a titanium film and an Al film is formed on the rear side of the p-type SiC substrate 61.

In such a light emitter, since the light emitter is formed in a square whose sidelength is 300 $\mu$m, the current block layer 6 is formed in a square whose sidelength is 150 $\mu$m and the pad electrode 7 is formed in a square whose sidelength is 160 $\mu$m, the electrode connection portion contacts the light-transmissive electrode 5 with an overlap of about 5 $\mu$m width in the region surrounding the current block layer 6. Further, the thickness of the pad electrode 7 is formed to be about ten times as large as the thickness of the current block layer 6. Thus, the breaking of connection of the electrode connection portion of the pad electrode at sidewalls of the current block layer 6 can be completely prevented. Therefore, it has become possible to produce light emitters free from the breaking of connection and the increase of resistance in a high yield.

EXAMPLE 5

Figure 5:
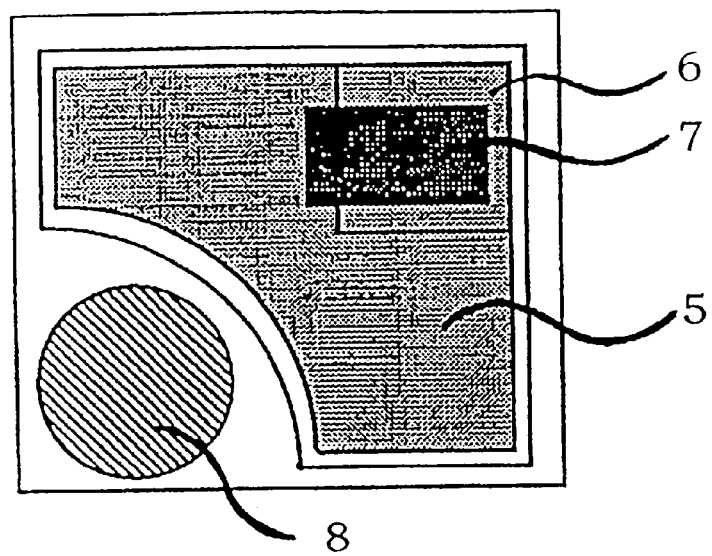
FIG. 5 is a schematic plan view illustrating still another light emitter of a gallium nitride compound semiconductor of the present invention.

Another light emitter in accordance with the present invention is shown in FIG. 5.

This light emitter is similar to the light emitter of FIG. 1 except that the pad electrode 7 is formed to be smaller than the current block layer 6 and the electrode connection portion is formed to be still smaller.

Figure 6:
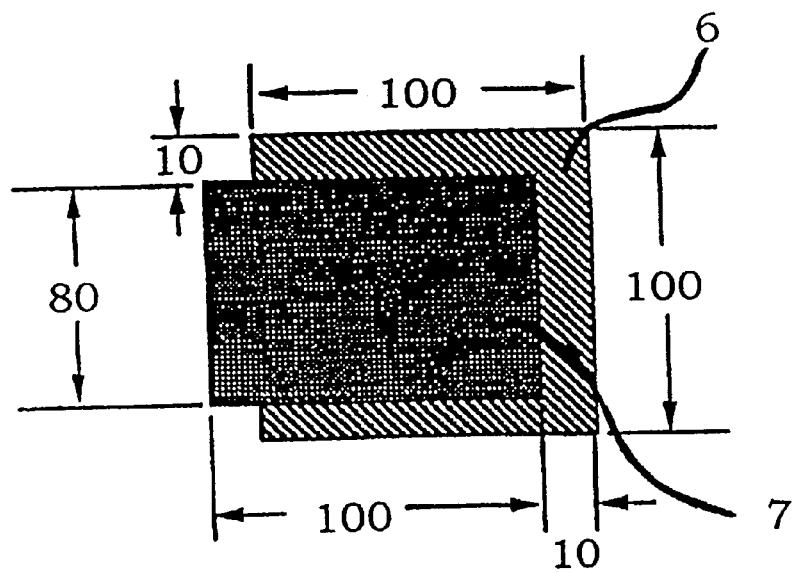
FIG. 6 is a schematic plan view illustrating the arrangement of a current block layer and a pad electrode with regard to FIG. 5.

The current block layer of this light emitter is formed to a thickness of 400 nm in a square whose sidelength is 100 $\mu$m. The light-transmissive electrode 5 has a two-layer structure of a Pd film of 3 nm thickness and an Au film of 4 nm thickness. The pad electrode 7 is formed of an Au film of 800 nm thickness and in a rectangle of 100 $\mu$m×80 $\mu$m, as shown in FIG. 6, so as not to extend over the current block layer 6 on one side of the current block layer 6. In this case, there are provided regions of 10 $\mu$m width where the light-transmissive electrode 5 is formed but the pad electrode 7 is not formed, on three sides of the current block layer 6.

Also in this light emitter, as in the aforesaid examples, since the thickness of the pad electrode 7 is larger than that of the current block layer 6, the pad electrode 7 and the electrode connection portion are positively, continuously connected to the light-transmissive electrode 5 from above the current block layer 6, and thereby the breaking of connection and the increase of resistance can be prevented.

Furthermore, in this example, the pad electrode 7 is formed to cover a sidewall of the current block layer 6 only at one side of the current block layer.

This is for reducing the area of a region of the pad electrode 7 which is formed on the light-transmissive electrode 5 contacting the p-type semiconductor layer 4, to one-fourth with respect to Example 1, because the pad electrode 7 does not transmit light. Thereby, it has become possible to decrease the light which cannot be taken out due to the existence of the pad electrode 7.

Further, about the site where the pad electrode 7 covers the sidewall of the current block layer 6 (the site where the electrode connection portion is formed), it is preferably selected in a direction to where a light emission region (the light emission region is a region where the light-transmissive electrode 5 directly contacts the p-type semiconductor layer 4) is broader as seen from the position where the current block layer 6 is formed. Accordingly, this example is formed as shown in FIG. 5. Thereby, a light emitter having a higher light emission efficiency can be realized because electric current can be supplied at a reduced resistance to the portion contributing to light emission.

Furthermore, electric current induced from the light-transmissive electrode 5 in a region surrounding the current block layer 6 to the p-type semiconductor layer 4 does not flow vertically in the p-type semiconductor layer 4, usually, but flows spreading laterally about 1 $\mu$m to about 10 $\mu$m. Thus, within the light emitter, light is generated also in a region which is about 1 $\mu$m to about 10 $\mu$m inside an area defined by the current block layer 6 at the surrounding of the current block layer 6, in addition to the region where the light-transmissive electrode 5 directly contacts the p-type semiconductor layer 4. For this reason, by not forming the pad electrode 7 in peripheral portions of 10 $\mu$m width on three sides of the current block layer 6, as shown in FIG. 6, light produced immediately below these portions can also be taken out through the current block layer 6. Thus, the light emission efficiency can be improved about 3% to about 10% as compared with Example 1.

EXAMPLE 6

Figure 7:
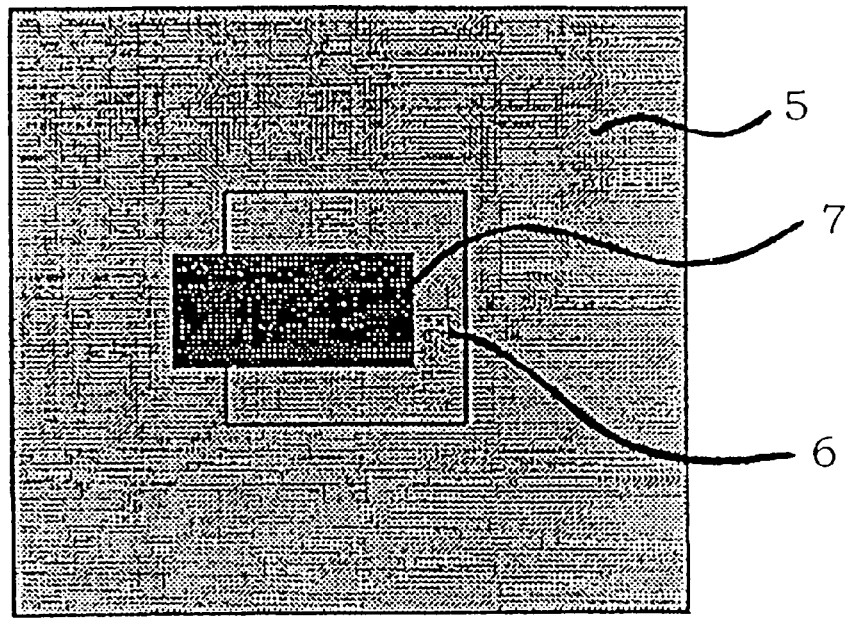
FIG. 7 is a schematic plan view illustrating still another light emitter of a gallium nitride compound semiconductor of the present invention.

A plan view of another light emitter in accordance with the present invention is shown in FIG. 7.

The light emitter of this example is substantially the same as the light emitter shown in FIG. 3 except that the size and location of a pad electrode 7 are different.

Figure 8:
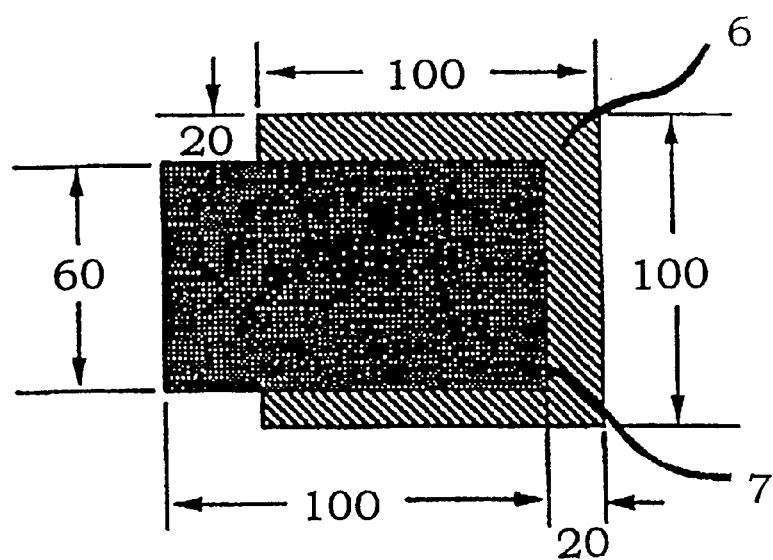
FIG. 8 is a schematic plan view illustrating the arrangement of a current block layer and a pad electrode with regard to FIG. 7.

Relationship between a current block layer 6 and the pad electrode 7 in the light emitter of this example is explained with reference to FIG. 8.

The current block layer 6 is formed of silicon nitride of 500 nm thickness in a square whose sidelength is 100 $\mu$m in the center of the emitter. On the other hand, a light-transmissive electrode 5 is constructed of two layers of a Ni film of 2 nm thickness and an Au film of 5 nm thickness and is formed over a p-type semiconductor layer 4 and a current block layer 6. The pad electrode 7 is formed of an Au film of 1,000 nm thickness in a rectangle of 100 $\mu$m×60 $\mu$m whose center is shifted leftward, as shown in FIG. 8. Thereby, the pad electrode 7 is spaced from three sides of the current block layer 6 by a distance of 20 $\mu$m, and in a leftward direction, the pad electrode crosses a step of the current block layer 6 and contacts the light-transmissive electrode 5 which directly connects to the p-type semiconductor layer 4, via an electrode connection portion.

In this light emitter, the breaking of connection and the increase of resistance can be completely prevented at sidewalls of the current block layer 6, while at the same time the light produced under the peripheral portion of the current block layer 6 can be efficiently taken out form the three sides of the current block layer 6 where the pad electrode 7 does not exist. Thus, a gallium nitride compound semiconductor light emitter having a high light emission efficiency is obtained.

EXAMPLE 7

Figure 9:
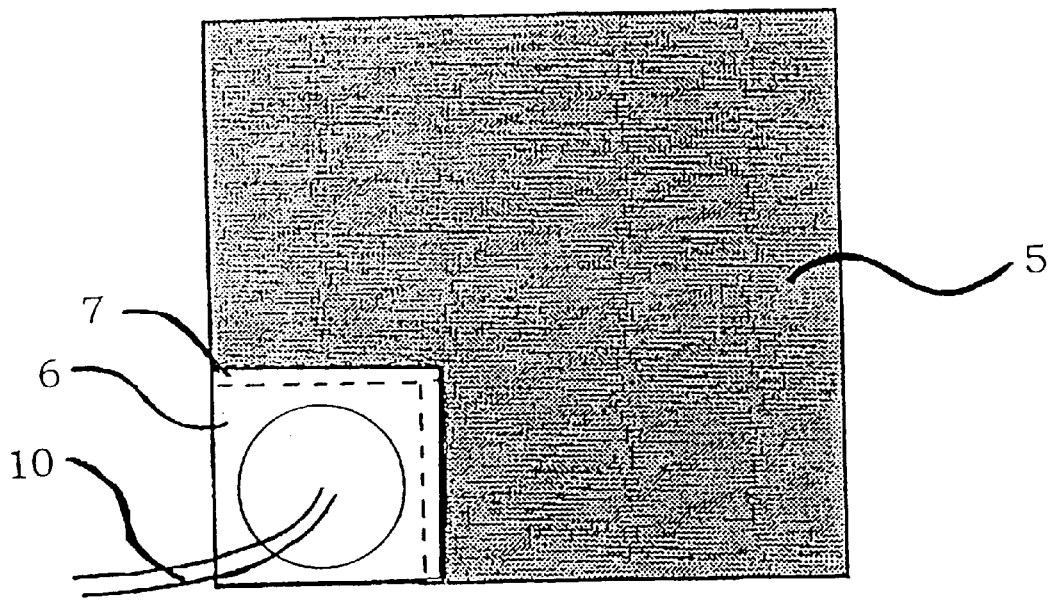
FIG. 9 is a schematic plan view illustrating still another light emitter of a gallium nitride compound semiconductor of the present invention.

A plan view of still another light emitter in accordance with the present invention is shown in FIG. 9.

The light emitter of this example is substantially the same as the light emitter shown in FIG. 3 except that the locations of the current block layer 6 and the pad electrode 7 are different.

In this example, an electrically conductive SiC substrate is used. Therefore, only a light-transmissive electrode 5, a current block layer 6 and a pad electrode 7 are disposed on the upper surface of the emitter. Further the pad electrode 7 is formed to have electrode connection sections extending 30 μm over the peripheral portions of the current block layer 6 on two sides of the current block layer 6, the two sides facing a region where the light-transmissive electrode 5 directly connects the semiconductor layer. This prevents the breaking of connection and the increase of resistance at sidewalls of the current block layer 6 and ensures positive injection of electric current into the semiconductor layer through the electrode connection portion and the light-transmissive electrode 5.

Further in this example, the pad electrode 7 and the current block layer 6 are formed in the proximity of a corner on the light emitting layer 4, unlike Examples 3 and 6. Thereby, a wire 10 for supplying electric power to the pad electrode 7 can be electrically connected with the pad electrode 7 without going over a region where the light-transmissive electrode 5, which is used as a luminous region, is located on the uppermost surface. Accordingly, the cutting-off of produced light from the light emitting layer 4 due to the wire 10 and the resulting ununiformity of a luminous pattern can be prevented. Thus, a substantially uniform light radiation pattern can be obtained.

According to the present invention, since the pad electrode has the electrode connection portion and is positively connected with the light-transmissive electrode through this electrode connection portion, it is possible to prevent the conventional problems, i.e., failure in injection of electric current into the light emitter because of disconnection of the light-transmissive electrode at sidewalls of the current block layer, and the increase of resistance in the emitter. Therefore, the electric current injected from the pad electrode is passed uniformly in the semiconductor layer via the light-transmissive electrode. Thus it is possible to produce light emitters with good behavior in a high yield.

Furthermore, the pad electrode is formed on the current block layer within the region defined by the current block layer and a light take-out region uncovered with the pad electrode is formed at the region surrounding of the pad electrode. Thus, even in the region where the current block layer exists, electric current is injected and spread from the region surrounding the current block layer into a light-generating region just under the current block layer. Accordingly, the light generated in the semiconductor layer can be efficiently taken out without being cut off by the pad electrode, and thus the light emission efficiency can be improved.

Further, by locating the pad electrode in one corner of the light emitter and forming a wire in such a manner that the wire does not go over the region where the light-transmissive electrode directly contacts the semiconductor, a uniform luminous pattern can be obtained.

What is claimed is:

1. A semiconductor light emitter comprising:
   a semiconductor layer for providing an electric current block region and an electric current injection region on a surface thereof;
   an electric current block layer formed on the semiconductor layer formed on the semiconductor layer for defining the electric current block region;
   a pad electrode formed on the electric current block layer; and
   a light-transmissive electrode formed on the semiconductor layer for defining the electric current injection region,
   the semiconductor light emitter being characterized in that the pad electrode has electrode connection portion which covers a side surface of the electric current block layer partially or entirely and reaches the light-transmissive electrode outside a region for forming the electric current block layer.

2. The semiconductor light emitter as set forth in claim 1, wherein the pad electrode is formed in a central portion of the light-transmissive electrode or in the proximity of a corner portion of the light-transmissive electrode.

3. The semiconductor light emitter as set forth in claim 1, wherein the light-transmissive electrode is formed to have a thickness of 4 to 20 nm, the pad electrode is formed to cover the electric current block layer is formed to have a thickness of 500 to 2,000-nm and the electric current block layer is formed to have a thickness of 150 nm or more and less than or equal to the double of the thickness of the pad electrode.

4. The semiconductor light emitter as set forth in claim 1, wherein the semiconductor layer is formed in a rectangular or substantially rectangular shape, the current block layer is formed in a corner or in the proximity of a corner of the semiconductor layer, at least a part of the electrode connection portion is located in a region opposed to the corner.

5. The semiconductor light emitter as set forth in claim 1, wherein the current block layer has a light take-out portion in a region where the pad electrode does not exist.

6. The semiconductor light emitter as set forth in claim 5, wherein the light take-out portion has a width of 5 μm or more from an edge of the electric current block layer.

7. The semiconductor light emitter as set forth in claim 1, wherein the semiconductor layer has at least one pn junction and is formed of a gallium nitride semiconductor of $In_sAl_tGa_{1-s-t}N$ ($0 \leq s$, $0 \leq t$, $s+t \leq 1$).

8. The semiconductor light emitter as set forth in claim 1, wherein the semiconductor layer is formed in a rectangular or a substantially rectangular shape, the pad electrode formed to cover the electric current block layer is formed in a corner or in the proximity of a corner of the semiconductor layer and is provided with a wire for external electric connection on the top thereof, and the wore extended from the top of the pad electrode to the periphery of the light emitter by the shortest distance.

9. The semiconductor light emitter as set forth in claim 2, wherein the light-transmissive electrode is formed to have a thickness of 4 to 20 nm, the pad electrode is formed to cover the electric current block layer is formed to have a thickness of 500 to 2,000-nm and the electric current block layer is formed to have a thickness of 150 nm or more and less than or equal to the double of the thickness of the pad electrode.

10. The semiconductor light emitter as set forth in claim 2, wherein the semiconductor layer is formed in a rectangular or substantially rectangular shape, the current block layer is formed in a corner or in the proximity of a corner of the semiconductor layer, at least a part of the electrode connection portion is located in a region opposed to the corner.

11. The semiconductor light emitter as set forth in claim 3, wherein the semiconductor layer is formed in a rectangular or substantially rectangular shape, the current block layer is formed in a corner or in the proximity of a corner of the semiconductor layer, at least a part of the electrode connection portion is located in a region opposed to the corner.

12. The semiconductor light emitter as set forth in claim 2, wherein the current block layer has a light take-out portion in a region where the pad electrode does not exist.

13. The semiconductor light emitter as set forth in claim 3, wherein the current block layer has a light take-out portion in a region where the pad electrode does not exist.

14. The semiconductor light emitter as set forth in claim 4, wherein the current block layer has a light take-out portion in a region where the pad electrode does not exist.

15. The semiconductor light emitter as set forth in claim 2, wherein the semiconductor layer has at least one pn junction and is formed of a gallium nitride semiconductor of $In_sAl_tGa_{1-s-t}N$ ($0 \leq s$, $0 \leq t$, $s+t \leq 1$).

16. The semiconductor light emitter as set forth in claim 2, wherein the semiconductor layer is formed in rectangular or a substantially rectangular shape, the pad electrode formed to cover the electric current block layer is formed in a corner or in the proximity of a corner of the semiconductor layer and is provided with a wire for external electric connection on the top thereof, and the wire extended from the top of the pad electrode to the periphery of the emitter by the shortest distance.

* * * * *